(12) United States Patent
Badami et al.

(10) Patent No.: US 7,064,409 B2
(45) Date of Patent: Jun. 20, 2006

(54) STRUCTURE AND PROGRAMMING OF LASER FUSE

(75) Inventors: Dinesh A. Badami, Essex Junction, VT (US); Tom C. Lee, Essex Junction, VT (US); Baozhen Li, South Burlington, VT (US); Gerald Matusiewicz, Poughkeepsie, NY (US); William T. Motsiff, Essex Junction, VT (US); Christopher D. Muzzy, Burlington, VT (US); Kimball M. Watson, Essex Junction, VT (US); Jean E. Wynne, Fair Haven, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,885

(22) Filed: Nov. 4, 2003

(65) Prior Publication Data

US 2005/0093091 A1    May 5, 2005

(51) Int. Cl.
*H01L 29/00* (2006.01)
(52) U.S. Cl. ............... 257/529; 257/209; 257/665
(58) Field of Classification Search ........... 257/209, 257/529, 665
See application file for complete search history.

(56) References Cited

U.S. PATENT DOCUMENTS

| 6,033,939 | A | 3/2000 | Agarwala et al. | |
| 6,074,940 | A * | 6/2000 | Lee et al. | 438/601 |
| 6,440,834 | B1 * | 8/2002 | Daubenspeck et al. | 438/601 |
| 6,444,544 | B1 * | 9/2002 | Hu et al. | 438/467 |
| 6,753,244 | B1 * | 6/2004 | Wu et al. | 438/601 |
| 2002/0017729 | A1 | 2/2002 | Macpherson | |
| 2002/0179990 | A1 | 12/2002 | Fischer et al. | |
| 2003/0025177 | A1 | 2/2003 | Kothandaraman | |
| 2003/0060009 | A1 | 3/2003 | Cheng et al. | |
| 2003/0062592 | A1 * | 4/2003 | Sato et al. | 257/529 |
| 2003/0080393 | A1 | 5/2003 | Dalton et al. | |
| 2003/0094996 | A1 | 5/2003 | Peter et al. | |
| 2003/0168715 | A1 * | 9/2003 | Bae | 257/529 |
| 2004/0217441 | A1 * | 11/2004 | Lehmann et al. | 257/530 |

* cited by examiner

*Primary Examiner*—Ori Nadav
(74) *Attorney, Agent, or Firm*—Schmeiser, Olsen & Watts; William D. Sabo

(57) ABSTRACT

A method and structure for fabricating a laser fuse and a method for programming the laser fuse. The laser fuse includes a first dielectric layer having two vias filled with a first self-passivated electrically conducting material. A fuse link is on top of the first dielectric layer. The fuse link electrically connects the two vias and includes a second material having a characteristic of changing its electrical resistance after being exposed to a laser beam. Two mesas are over the fuse link and directly over the two vias. The two mesas each include a third self-passivated electrically conducting material. The laser fuse is programmed by directing a laser beam to the fuse link. The laser beam is controlled such that, in response to the impact of the laser beam upon the fuse link, the electrical resistance of the fuse link changes but the fuse link is not blown off. Such electrical resistance change is sensed and converted to digital signal.

7 Claims, 4 Drawing Sheets

STRUCTURE AND PROGRAMMING OF LASER FUSE

BACKGROUND OF INVENTION

1. Technical Field

The present invention relates to the design of a laser fuse and a method of programming the laser fuse.

2. Related Art

A typical laser fuse of prior art is programmed by directing a laser beam to the laser fuse. The heating and expansion of the fuse causes the passivation over the fuses to open and the fuse to vaporize. The cut ends of the laser fuse are now open and susceptible to oxidation and corrosion which can extend through the circuit. In addition, the expansion of the fuse can cause cracking downward or laterally which can cause damage to the surrounding devices.

As a result, a design of a laser fuse that minimizes corrosion and oxidation caused by fuse programming to the devices surrounding the fuse is needed. Also, a method of programming the laser fuse that reduces the risk of cracking to the structures surrounding the fuse is needed.

SUMMARY OF INVENTION

The present invention provides a method for forming an electronic structure, comprising the steps of forming at least two vias in a first dielectric layer; filling the two vias with a first self-passivated electrically conducting material; forming a fuse link layer on top of the first dielectric layer, the fuse link layer comprising a second material having a characteristic of changing its electrical resistance after being exposed to a laser beam; forming a mesa layer over the fuse link layer, the mesa layer comprising a third self-passivated electrically conducting material; and forming a fuse link and two mesas from the fuse link layer and the mesa layer, respectively, wherein the fuse link electrically connects the two vias, and the two mesas are directly over the two vias.

The present invention also provides an electronic structure, comprising a first dielectric layer having at least two vias filled with a first self-passivated electrically conducting material; a fuse link on top of the first dielectric layer, the fuse link electrically connecting the two vias and comprising a second material having a characteristic of changing its electrical resistance after being exposed to a laser beam; and two mesas over the fuse link and directly over the two vias, the two mesas comprising a third self-passivated electrically conducting material.

The present invention also provides a method for programming a laser fuse, the laser fuse having a fuse link comprising a material having a characteristic of changing its electrical resistance after being exposed to a laser beam, the method comprising the step of directing the laser beam to the fuse link, the laser beam being controlled such that, in response to the impact of the laser beam upon the fuse link, the electrical resistance of the fuse link changes but the fuse link is not blown off.

The present invention also provides an electronic structure, comprising a first dielectric layer having at least a first via and a second via both filled with a first electrically conducting material; a first oxygen-getter shield and a second oxygen-getter shield being directly above and in physical contact with the first electrically conducting material in the first and second vias, respectively, the first and second oxygen-getter shields comprising a second electrically conducting, oxygen-getter material; and a fuse link electrically connecting the first and second oxygen-getter shields, the fuse link comprising a third material having a characteristic of changing its electrical resistance after being exposed to a laser beam.

The present invention provides a method and structure for fabricating a laser fuse that minimize corrosion and oxidation to the devices beneath the laser fuse.

The present invention also provides a method for programming the laser fuse that does not cause cracking to the structures surrounding the laser fuse.

DETAILED DESCRIPTION

Figure 1:
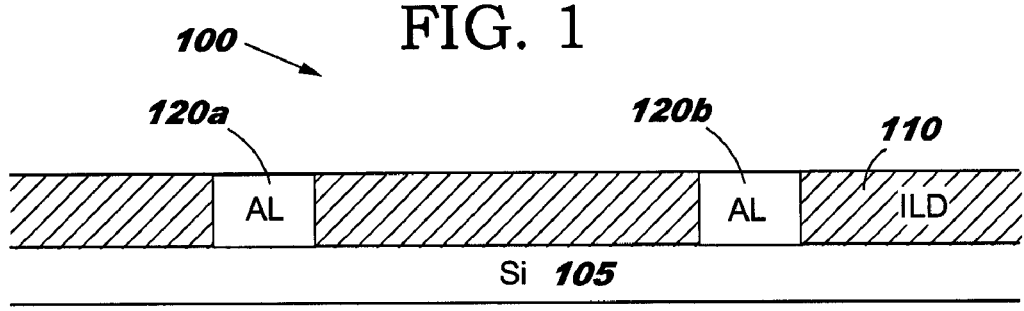
FIG. 1 illustrates a front-cross sectional view of an electronic structure comprising an Inter-Level Dielectric (ILD) layer on a substrate, said ILD layer comprising two vias, in accordance with embodiments of the present invention.

FIG. 1 illustrates a front-cross sectional view of an electronic structure 100 used to build a laser fuse in accordance with embodiments of the present invention. In one embodiment, the electronic structure 100 comprises an Inter-Layer Dielectric (ILD) layer 110 at the top of a silicon substrate 105. The ILD layer 110 contains two vias 120a and 120b filled with, illustratively, aluminum (Al). In one embodiment, the ILD layer 110 can be made of low-K, or silicon nitride or silicon oxide.

Illustratively, the ILD layer 110 can be deposited on top of the silicon substrate 105. Then, the two vias 120a and 120b are created by etching process. In one embodiment, the etching process can involve several steps. First, a positive photoresist layer (not shown) is deposited on top of the ILD layer 110 and a pattern on the photoresist layer is created that exposes the two regions of the ILD layer 110 where the two vias 120a and 120b will be located. Then, the two exposed regions of the ILD layer 110 are etched away by etching process creating the two vias 120a and 120b. After that, the photoresist layer is removed and aluminum can be deposited over the entire ILD layer 110 filling the two vias 120a and 120b with aluminum. Then, the excess aluminum outside the vias 120a and 120b is removed by CMP (chemical mechanical polishing), resulting in the electronic structure 100 in FIG. 1. For simplicity purposes, the devices including sensing circuits under the ILD layer 100 that are electrically connected to the aluminum-filled vias 120a and 120b are not shown.

Figure 2:
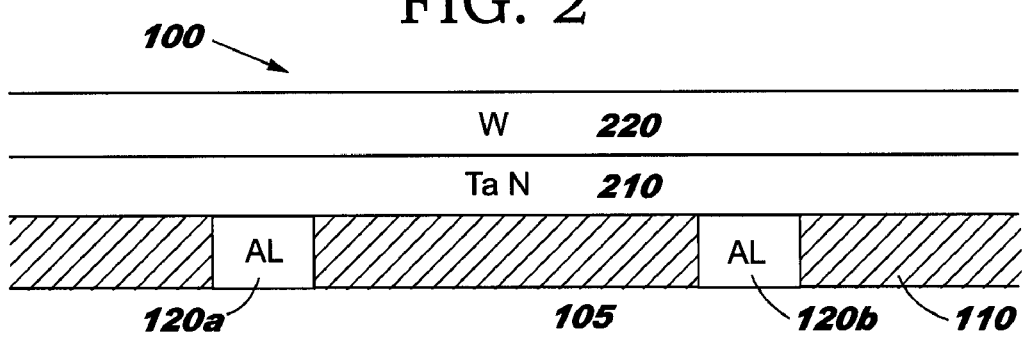
FIG. 2 illustrates FIG. 1 after a layer of TaN (tantalum nitride) followed by a layer of W (tungsten) are deposited upon the ILD layer.

FIG. 2 illustrates FIG. 1 after a layer 210 of TaN (tantalum nitride) followed by a layer 220 of W (tungsten) are deposited upon the ILD layer 110. In one embodiment, the TaN layer 210 is deposited upon the ILD layer 110 by PVD (Physical Vapor Deposition) or CVD (Chemical Vapor Deposition) process. Then, the W layer 220 is deposited upon TaN layer 210 by CVD process. In one embodiment, the TaN layer 210 can be a few hundred Angstrom thick.

Figure 3:
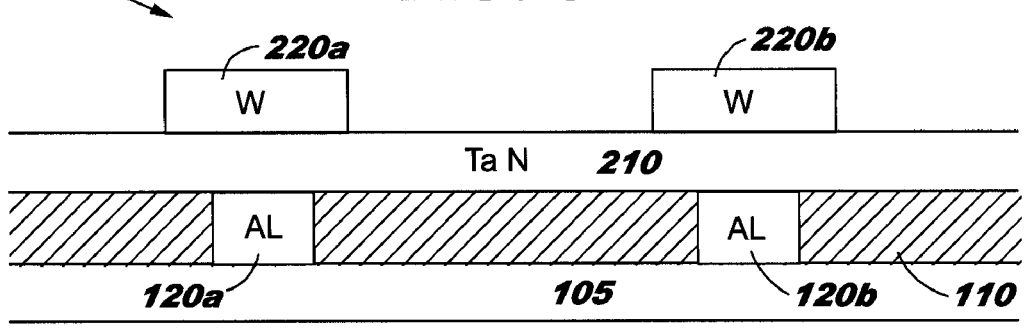
FIG. 3 illustrates FIG. 2 after most of the W layer is etched away except for two mesas and over the two vias.

FIG. 3 illustrates FIG. 2 after most of the W layer 220 is etched away except for two mesas 220a and 220b over the two vias 120a and 120b, respectively. In one embodiment, the etching process can involve several steps. First, a positive photoresist layer (not shown) can be deposited upon the W layer 220. Then, a pattern on the photoresist layer is created to cover/protect two regions of the W layer 220 directly above the two vias 120a and 120b. Then, etching (dry or wet) can be carried out to remove the exposed (not protected by the photoresist layer) regions of the W layer 220. Finally, the photoresist layer is removed. The resulting structure 100 is shown in FIG. 3 with two W mesas 220a and 220b being created directly above the two vias 120a and 120b.

Figure 4:
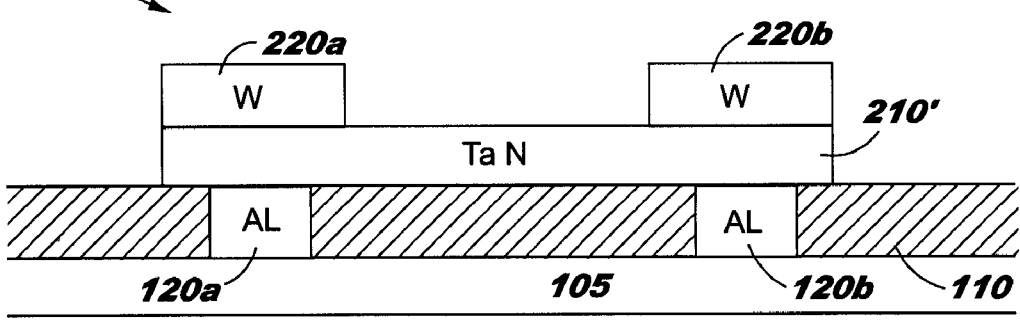
FIG. 4 illustrates FIG. 3 after most of the TaN layer is etched away except for the region above and between the two vias, the remaining TaN layer being a fuse link.

FIG. 4 illustrates FIG. 3 after most of the TaN layer 210 is etched away except for the region above and between the two vias 120a and 120b. In one embodiment, the etching process can involve several steps. First, a positive photoresist layer (not shown) can be deposited upon the TaN layer 210 covering also the two W mesas 220a and 220b. Then, a pattern on the photoresist layer is created to cover/protect only the region of the TaN layer 210 directly above and between the two vias 120a and 120b. Then, etching (dry or wet) can be carried out to remove the exposed (not covered by the photoresist layer) regions of the TaN layer 210. Finally, the photoresist layer is removed. The resulting structure 100 is shown in FIG. 4 with a TaN fuse link 210" being created directly above and between the two vias 120a and 120b. The TaN fuse link 210" electrically connects the two aluminum-filled vias 120a and 120b.

Figure 5:
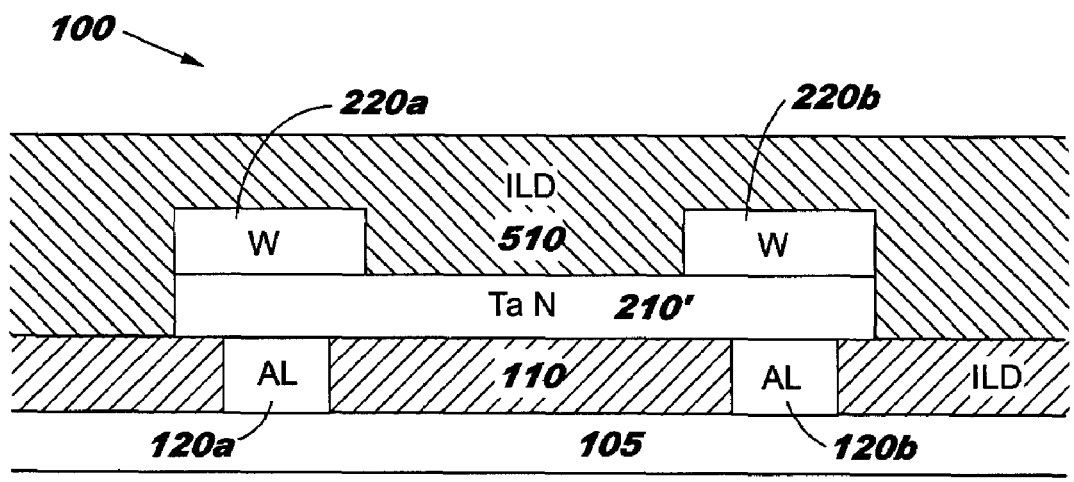
FIG. 5 illustrates FIG. 4 after a passivation layer of ILD material is deposited upon the entire structure 100 of FIG. 4.

FIG. 5 illustrates FIG. 4 after a passivation layer 510 of ILD material is deposited upon the entire structure 100 of FIG. 4. The purpose of the ILD passivation layer 510 is to protect the devices on the wafer including the structure 100 from contaminants and moisture. The ILD passivation layer 510 also serves as a scratch protection layer. In one embodiment, the ILD passivation layer 510 can be made of silicon nitride ($Si_xN_y$). In one embodiment, the ILD passivation layer 510 is deposited upon the structure 100 of FIG. 4 by CVD (Chemical Vapor Deposition) process.

Figure 6:
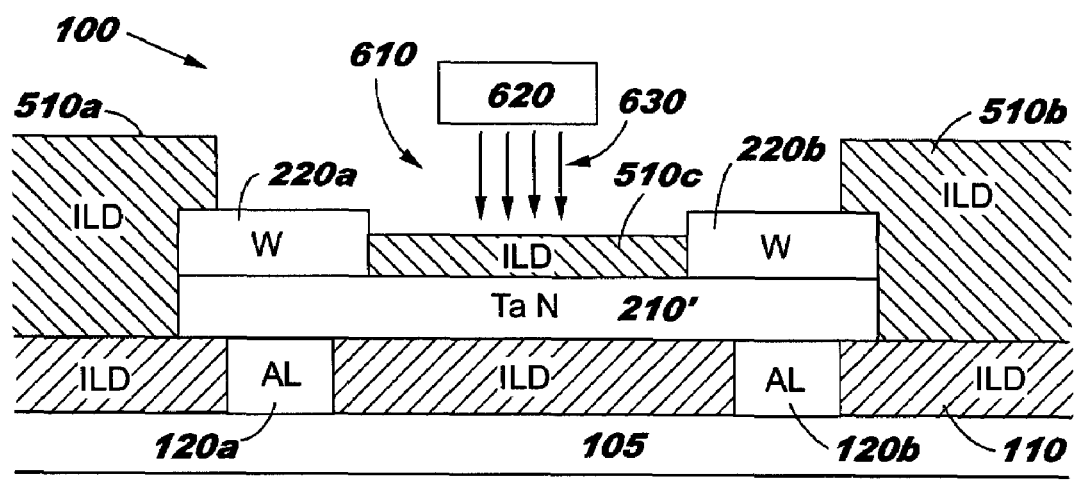
FIG. 6 illustrates FIG. 5 after a section of the passivation layer above the fuse link is etched away to create an opening.

FIG. 6 illustrates FIG. 5 after a section of the ILD layer 510 above the fuse link 210" is etched away to create an opening 610. In one embodiment, the etching process can involve several steps. First, a positive photoresist layer (not shown) can be deposited upon the ILD layer 510. Then, a pattern on the photoresist layer is created with a mask to expose only the region of the ILD layer 510 directly above the TaN fuse link 210". Then, etching (dry or wet) can be carried out to partially remove the exposed (not covered by the photoresist layer) region of the ILD layer 510. Finally, the photoresist layer is removed. The resulting structure 100 is shown in FIG. 6 with the two W mesas 220a and 220b being exposed partly and the fuse link 210" being covered by a remaining ILD layer 510c. In one embodiment, the laser fuse of the present invention can be considered to comprise the TaN fuse link 210" and the two Al-filled vias 120a and 120b, and therefore, can be referred to, hereafter, as the laser fuse 210",120. Because the fuse link 210" comes from the TaN layer 210, the TaN layer 210 can be referred to as the fuse link layer 210. Similarly, the two mesas 220a and 220b come from the W layer 220, the layer 220 can be referred to as the mesa layer 220.

Figure 7:
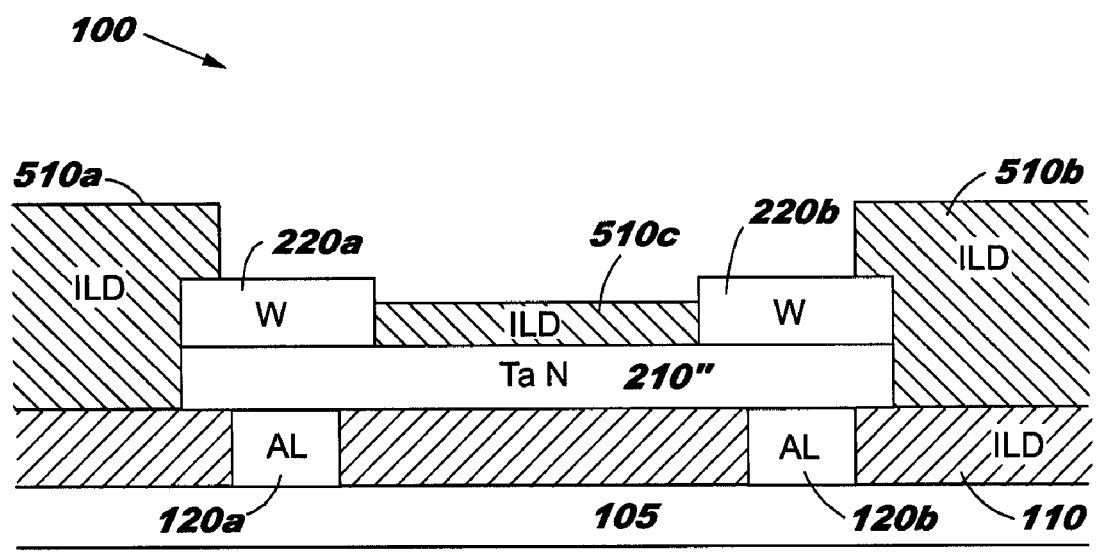
FIG. 7 illustrates the structure of FIG. 6 after the fuse link is exposed to a laser beam.

In one embodiment, the programming of the laser fuse 210",120 involves directing a laser beam 630 from a laser source 620 down on the TaN fuse link 210" of the laser fuse 210",120 through the opening 610. The fuse link 210" absorbs some energy of the laser beam 630. The energy level of the laser beam 630 is controlled so as to be below an energy level that may physically damage or even blow off the fuse link 210" causing cracking to the surrounding structures, but strong enough to change the phase of the material of which the fuse link 210" is made (i.e., TaN). FIG. 7 illustrates the structure 100 of FIG. 6 after the fuse link 210" is exposed to the laser beam 630. As can be seen in FIG. 7, there is no geometrical change to the fuse link 210". However, in FIG. 7, the fuse link is given a new reference numeral 210"" to indicate that the material of which the fuse link 210"" is made (i.e., TaN) has undergone phase change and, therefore, has a different characteristic (i.e., higher electrical resistance). As a result of the phase change in TaN, the electrical resistance of the TaN fuse link 210"" increases. In other words, the electrical resistance of the electrically conducting path between the two vias 120a and 120b via the fuse link 220"" increases. In one embodiment, this electrical resistance increase is sensed by a sensing circuit (not shown) and converted to a digital signal (e.g., from logic 1 corresponding to low electrical resistance to logic 0 corresponding to high electrical resistance). As a result, the laser fuse 210",120 is programmed without blowing it off to create an open circuit as in prior art. Therefore, the possibility and degree of cracking is minimized. In the case of TaN material, the laser energy level required to sufficiently increase the TaN electrical resistance is much lower than that required to blow off a typical laser fuse of the prior art. As a result, compared with the prior art, the possibility and degree of cracking caused by the fuse programming method of the present invention is much lower. Because the ILD material of the ILD layer 510c is transparent to laser beams, the thickness of the ILD layer 510c is not critical to the fuse programming method of the present invention. Most of the energy of the laser beam 630 can reach the fuse link 220" and cause an increase in the electrical resistance of the laser fuse 210",120. As a result, the step of removing a portion of the ILD layer 510 directly above the laser fuse 210",120 can be omitted if the two W mesas 220a and 220b do not need to be electrically connected to outside world (e.g., bond pads). If the two W mesas 220a and 220b need to be electrically connected to outside world, the portion of the ILD layer 510 directly above the fuse link 210" can be removed so as to expose the mesas 220a and 220b. Whether the ILD layer 510c (FIG. 6) or nothing is left on top of the fuse link 210" is not critical to the fuse programming process.

In the embodiments described above, the two vias 120a and 120b are filled with aluminum which is a good electrical conductor and also a good self-passivated material. Aluminum is a good self-passivated material because it reacts with oxygen to create a compound inert to oxygen that prevents further oxidation and corrosion caused by oxygen in the air and water vapor. The use of aluminum to fill the two vias 120a and 120b reduces the oxidation and corrosion of the devices under the laser fuse 210",120. Alternatively, other materials that are both electrically conductive and self-passivated may be used to fill the two vias 120a and 120b. The use of a electrically conducting and self-passivated material to fill the two vias 120a and 120b helps minimize the oxidation and corrosion of the devices under the laser fuse 210",120.

In the embodiments described above, the fuse link 210" is made of TaN which is self-passivated and which changes its electrical resistance when the laser beam 630 shines on it. Because the TaN fuse link 210" is self-passivated, oxidation and corrosion of the devices under the laser fuse 210",120 is reduced even when the TaN fuse link 210" is exposed (i.e., the ILD layer 510c is completely removed). In an alternative embodiment, another material (e.g., titanium nitride TiN, or tungsten nitride WN) can be used for the fuse link 210" which is self-passivated and has the characteristic of changing its electrical resistance after the impact of the laser beam 630. In yet another embodiment, the material used has the characteristic of changing (increasing or decreasing) its electrical resistance after being exposed to a laser beam.

In the embodiments described above, the two mesas 220a and 220b are made of W (tungsten) which is both electrically conducting and self-passivated. Because W is electrically conductive, electric connections can be made between the components of the laser fuse 210",120 and the outside world (e.g., bond pads). Because W is self-passivated and the two W mesas 220a and 220b are situated directly above the two vias 120a and 120b, oxidation and corrosion of the devices under the laser fuse 210",120 through the two vias 120a and 120b is minimized. In an alternative embodiment, the two mesas 220a and 220b can be made of another material which is both electrically conductive and self-passivated (e.g., aluminum).

In the embodiments described above, the fuse link 210" has a higher electrical resistance after being exposed to the laser beam 630. In an alternative embodiment, the fuse link 210" can be made of another material that has a lower electrical resistance after being exposed to the laser beam 630. Then, the electrical resistance decrease can be sensed and converted into a digital signal (e.g., from logic 0 to logic 1).

Figure 8A:
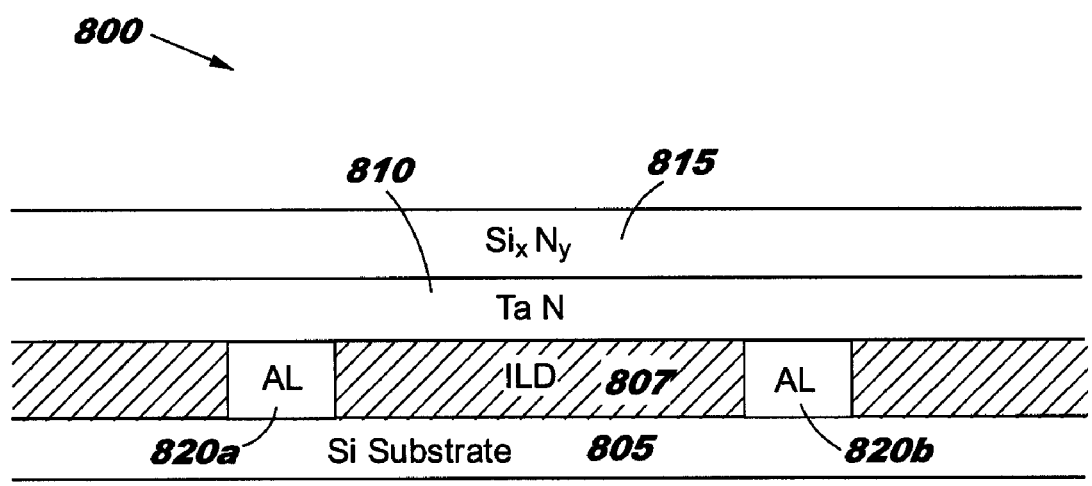
FIGS. 8A–8E illustrate a front-cross sectional view of an electronic structure going through a series of fabrication steps in accordance with embodiments of the present invention.

FIG. 8A–E illustrate the steps of fabricating an electronic structure 800 in accordance with embodiments of the present invention. FIG. 8A illustrates a front cross-sectional view of the electronic structure 800 used to build a laser fuse in accordance with embodiments of the present invention. In one embodiment, the electronic structure 800 comprises an ILD layer 807 at the top of a silicon (or any other semiconductor) substrate 805. The ILD layer 807 contains two vias 820a and 820b filled with aluminum (or any other good electrically conducting material). A laser fuse layer 810 made of TaN (or any other material that has a characteristic of changing electrical resistance after being exposed to a laser beam) is deposited on top of the ILD layer 807. A protection layer 815 made of silicon nitride (or any material capable of protecting the layer 810 below) is deposited on the laser fuse layer 810.

Figure 8B:
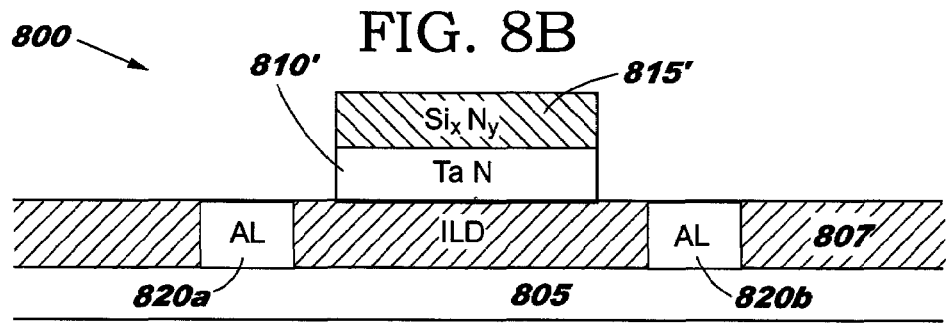

FIG. 8B illustrates FIG. 8A after a mesa 810",815" is formed by etching away most of the two layers 810 and 815 leaving only the mesa 810",815" between the two vias 820a and 820b. The mesa 810",815" comprises a TaN fuse link 810" and a protection layer 815".

Figure 8C:
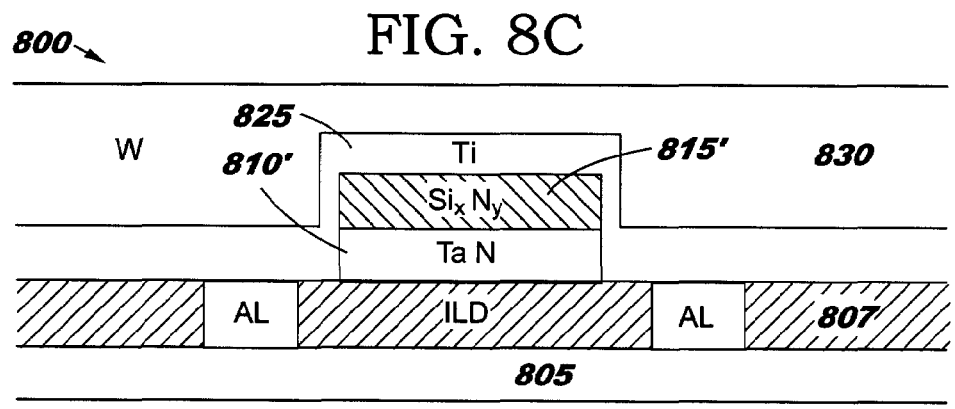

FIG. 8C illustrates FIG. 8B after an oxygen-getter layer 825 made of titanium (or any other good electrically conducting, oxygen getter material) is deposited on the entire structure 800 of FIG. 8B (an oxygen getter material is a material that can easily react with and absorbs oxygen so as to prevent the latter from escaping from the former). Then, an end contact layer 830 made of tungsten (or any good electrically conducting material) is deposited on the oxygen-getter layer 825.

Figure 8D:
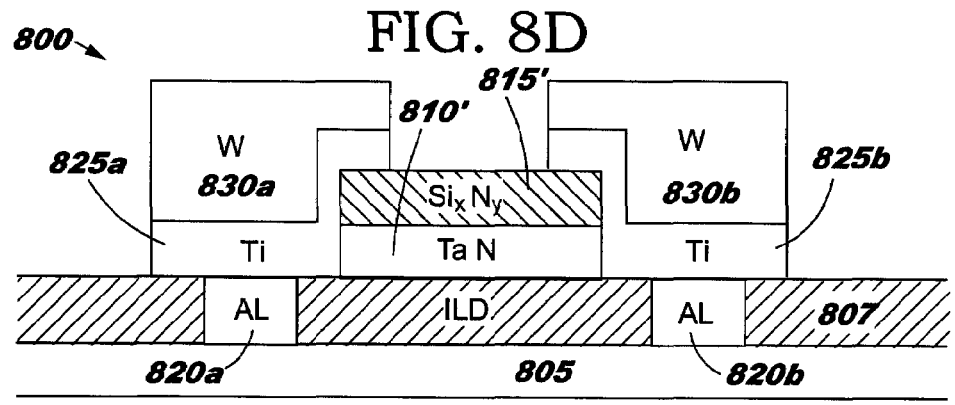

FIG. 8D illustrates FIG. 8C after two mesas 825a,830a and 825b,830b are formed by etching away most of the layers 825 and 830 leaving only the two mesas 825a,830a and 825b,830b directly above the two vias 820a and 820b, respectively. The mesa 825a,830a comprises an oxygen-getter shield 825a and an end contact mesa 830a. Similarly, the mesa 825b,830b comprises an oxygen-getter shield 825b and an end contact mesa 830b.

Figure 8E:
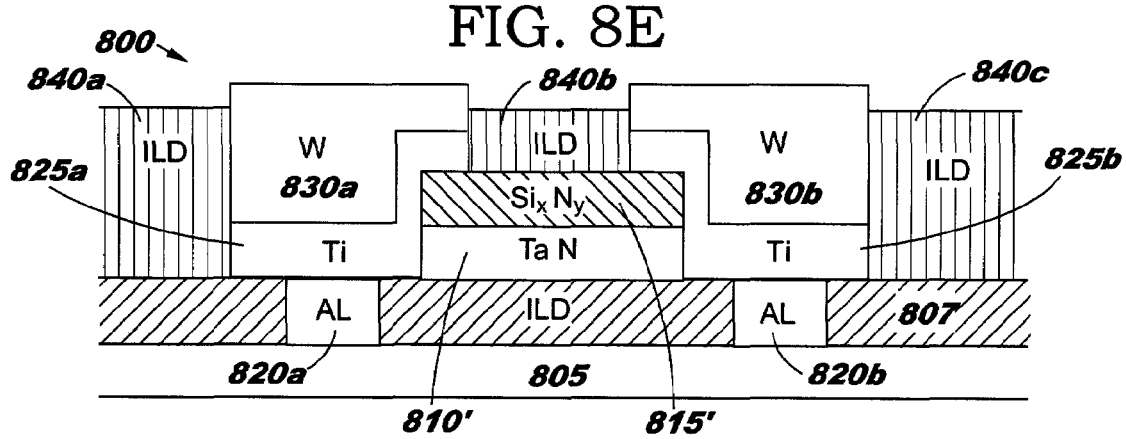

FIG. 8E illustrates FIG. 8D after an ILD layer 840 is deposited on the entire structure 800 of FIG. 8D except for the two end contact mesas 830a and 830b. Because Ti is a good electrical conductor, the oxygen-getter shields 825a and 825b electrically connect the fuse link 810" to the vias 820a and 820b, respectively. Because titanium (Ti) is also a good oxygen getter material, the oxygen-getter shields 825a and 825b effectively protect the devices beneath the two vias 820a and 820b, respectively, from corrosion and oxidation.

In summary, the fuse programming process of the present invention is nondestructive. The laser beam 630 (see FIG. 6) only changes the phase of TaN, and therefore, increases the electrical resistance of the TaN fuse link 210". Also, laser energy used for fuse programming is reduced. As a result, the risk of dielectric cracking during and post programming process is mitigated because of the lower programming laser energy and the nondestructive nature of the fuse programming process. The lower possibility of dielectric cracking leads to two advantages. First, yield and reliability is enhanced, and second, the feasibility of using low-K dielectric materials in the global wiring level is improved.

With the combination use of the self-passivated end connections (the two W mesas 220a and 220b) and the self-passivated fuse element (the fuse link 210" and the two Al-filled vias 120a and 120b), the ingress path of oxygen and moisture through the fuse elements and the defective liner (if any) is eliminated. Also, because of the diffusion barrier characteristic of TaN, the lateral ingress path of oxygen and moisture from the fuse elements to the end connections is removed.

The advantage of using self-passivated electrical conductor (aluminum) in the vias 120a and 120b as the contact connection between the TaN fuse link 210" and the sensing circuit (not shown) beneath the fuse 210",120 is that the self-passivated electrical conductor serves as oxygen and moisture getter to minimize the possibility of oxygen and moisture penetrating through the defective liner (if any) at bottom corner of the vias 120a and 120b.

The final passivation-over-fuse process has wider flexibility because the thickness of the passivation ILD layer 510 directly over the fuse 210",120 is not critical to the programming process. Moreover, one type of fuses (e.g., the fuse 210",120) can be used for different technologies, resulting in manufacturing cost reduction.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:
1. An electronic structure, comprising:
a first dielectric layer having at least first and second vias filled with a first self-passivated electrically conducting material;

a fuse link on top of the first dielectric layer, the fuse link electrically connecting the first and second vias and comprising a second material having a characteristic of changing its electrical resistance after being exposed to a laser beam; and first and second mesas directly above the fuse link and directly above the first and second vias, respectively, the first and second mesas each comprising a third self-passivated electrically conducting material, wherein the fuse link is disposed between the first mesa and the first dielectric layer, and wherein the fuse link is disposed between the second mesa and the first dielectric layer.

2. The electronic structure of claim 1, wherein the second material comprises a substance selected from the group consisting of TaN, TiN, and WN.

3. The electronic structure of claim 1, wherein the first self-passivated electrically conducting material comprises a substance selected from the group consisting of Al and W.

4. The electronic structure of claim 1, wherein the third self-passivated electrically conducting material comprises a substance selected from the group consisting of Al and W.

5. An electronic structure, comprising:
a first dielectric layer having at least a first via and a second via both filled with a first electrically conducting material;
a first oxygen-getter shield and a second oxygen-getter shield being directly above the first and second filled vias and in direct physical contact with the first electrically conducting material in the first and second vias, respectively, the first and second oxygen-getter shields comprising a second electrically conducting, oxygen-getter material; and a fuse link electrically connecting the first and second oxygen-getter shields, the fuse link comprising a third material having a characteristic of changing its electrical resistance after being exposed to a laser beam, wherein first and second regions of the first and second oxygen-getter shields, respectively, are directly above the fuse link, such that the fuse link is disposed between the first region of the first oxygen-getter shield and the first dielectric layer, and such that the fuse link is disposed between the second region of the second oxygen-getter shield and the first dielectric.

6. The electronic structure of claim 5, further comprising a first mesa and a second mesa being directly above and in direct physical contact with the first and second oxygen-getter shields, respectively, such that the first oxygen-getter shield is disposed between the first mesa and the first dielectric layer and such that the second oxygen-getter shield is disposed between the second mesa and the first dielectric layer, the first and second mesas comprising a fourth electrically conducting material.

7. The electronic structure of claim 5, wherein the second electrically conducting, oxygen-getter material comprises titanium.

* * * * *